US009548172B2

(12) United States Patent
Hauck et al.

(10) Patent No.: US 9,548,172 B2
(45) Date of Patent: Jan. 17, 2017

(54) CONTROL DEVICE, IN PARTICULAR FOR A DOMESTIC APPLIANCE

(71) Applicant: Electrolux Home Products Corporation N.V., Brussels (BE)

(72) Inventors: Alexander Hauck, Rothenburg/Tauber (DE); Volkmar Bunzel, Rothenburg/Tauber (DE); Klaus Winkelmann, Rothenburg ob derTauber (DE); Dominik Rauh, Rothenburg ob derTauber (DE)

(73) Assignee: ELECTROLUX HOME PRODUCTS CORPORATION N.V., Brussels (BE)

( * ) Notice: Subject to any disclaimer, the term of this patent is extended or adjusted under 35 U.S.C. 154(b) by 44 days.

(21) Appl. No.: 14/416,696

(22) PCT Filed: Jul. 9, 2013

(86) PCT No.: PCT/EP2013/064486
§ 371 (c)(1),
(2) Date: Jan. 23, 2015

(87) PCT Pub. No.: WO2014/016113
PCT Pub. Date: Jan. 30, 2014

(65) Prior Publication Data
US 2015/0206669 A1    Jul. 23, 2015

(30) Foreign Application Priority Data
Jul. 25, 2012    (EP) .................................... 12177754

(51) Int. Cl.
*H01H 9/00* (2006.01)
*H01H 13/02* (2006.01)
*H03K 17/96* (2006.01)

(52) U.S. Cl.
CPC ............ *H01H 13/023* (2013.01); *H03K 17/96* (2013.01); *H03K 17/962* (2013.01);
(Continued)

(58) Field of Classification Search
CPC .. H01H 13/023; H01H 19/025; H01H 21/025; F25D 2327/001; F25D 2400/36; F25D 27/005
(Continued)

(56) References Cited

U.S. PATENT DOCUMENTS 7,690,828 B2 *   4/2010   Smith .................. G02B 6/0001
                                                              200/314
7,915,553 B2 *   3/2011   Arione ................. H03K 17/962
                                                              200/314
2008/0316753 A1  12/2008  Smith et al.

FOREIGN PATENT DOCUMENTS

EP    2048781    4/2009
EP    1985930   10/2009

OTHER PUBLICATIONS

AVAGO Technologies—Light Guide Techniques Using LED Lamps—Application Brief I-003, Dec. 11, 2006.*
(Continued)

*Primary Examiner* — Vanessa Girardi
(74) *Attorney, Agent, or Firm* — Pearne & Gordon LLP

(57) ABSTRACT

The present invention relates to a control device having at least one front panel, at least one button panel arranged behind the front panel, and at least one switch responsive to a user's touch of a switchable area on a front side of the front panel in front of said switch. The switch includes at least one light source element arranged at a rear side of the button panel illuminating the rear side of the front panel, and at least one reflector element arranged behind the button panel and the light source element to reflect the light to the rear side of the button panel. The button panel includes at least
(Continued)

one cut out that corresponds with the switchable area of the switch or more switchable areas of neighbored switches, so that the light can pass through the cut-out and the front panel to be out of the control device.

15 Claims, 6 Drawing Sheets

(52) U.S. Cl.
CPC ..... *H03K 17/9622* (2013.01); *H01H 2207/04* (2013.01); *H01H 2219/028* (2013.01); *H01H 2219/036* (2013.01); *H01H 2219/06* (2013.01); *H03K 2217/96042* (2013.01); *H03K 2217/960785* (2013.01); *Y10T 29/49105* (2015.01)

(58) Field of Classification Search
USPC ................ 200/310, 313, 314, 317; 345/170; 362/23.03
See application file for complete search history.

(56) References Cited

OTHER PUBLICATIONS

International Search Report for PCT/EP2013/064486, dated Dec. 4, 2013, 2 pages.

\* cited by examiner

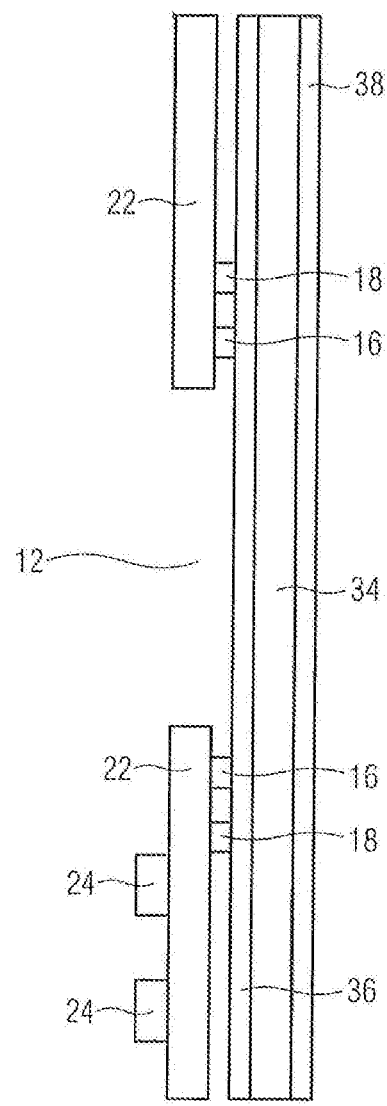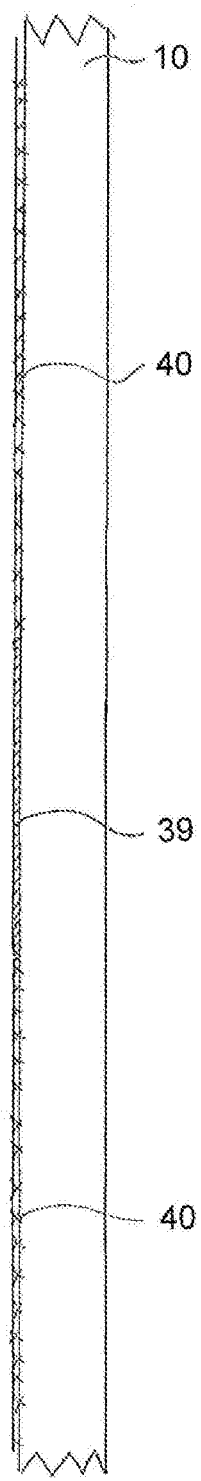

200
CONTROL DEVICE, IN PARTICULAR FOR A DOMESTIC APPLIANCE

BACKGROUND OF THE INVENTION

1. Field of the Invention

The present invention relates to a control device, in particular for a domestic appliance. Further, the present invention relates to a button panel for said control device. Moreover, the present invention relates to a method for assembling a control device, in particular for a domestic appliance.

2. Description of the Prior Art

An appliance includes often a control device with one or more touch switches. For example, said touch switches may be of a capacitive type, an inductive type, an optical type, an infrared type or a funk type. In other words, the touch switches do not contain any mechanical elements. None of the components of the touch switches is distorted. The touch switches of the control device of an appliance, in particular of a domestic appliance, should be illuminated in order to indicate the corresponding operation and/or a parameter relating to said switch or corresponding operation. Further, the illumination should also be sufficient, if the environmental illumination conditions are disadvantageous. For this purpose, known touch switches are lightened by illumination means.

Furthermore, another problem is that the illumination of a switchable area of the switch is not homogeneous enough. Some parts are intensively illuminated, while other parts are quite dark, since touch switch may include one or more electrical tracks arranged on the printed circuit board. Said electrical tracks are usually made of copper or other opaque materials. In particular, the electrical tracks of the touch switch are provided as sensor for detecting the proximity or touch of a human finger. Further, the electrical track may be provided as antenna for detecting infrared or radio signals. However, the electrical tracks may cross the illuminated area of the touch switch and constrain the illumination. Such a design is even more complex and expensive and results in higher energy consumption, since some light is absorbed by a switchable area.

EP 1 985 930 B1 discloses a control device with a front panel for a domestic appliance. At the rear side of the front panel are one or more switches having at least one illumination element. The front panel is made of transparent glass or plastics with printed icons. The illumination element consists of at least one light source element arranged on the rear side of a printed circuit board and at least one reflector element for indirectly lightning of a rear side of the switch. The reflector element covers the light source element and the illuminated area from behind. The control panel must be of a transparent material in order to allow the light passing through at least a part of the switchable areas. However, it is difficult to find any suitable material for a button panel, which is transparent on the one hand and able to carry electric and/or electronic components. Further, the control device has a complex design, so that the costs for the illumination of the switch are relatively high. In particular, the costs of a transparent material for the button panel and printed circuit board are high.

SUMMARY OF THE INVENTION

It is an object of the present invention to provide an improved control device with a front panel, which front panel may be used as a printed circuit board and/or a carrier for components of the control device. The control device and its components shall have low complexity and be aesthetically attractive.

The object of the present invention is achieved by the control device according to claim 1.

According to the present invention the button panel includes at least one cut-out, wherein the cut-out corresponds with one switchable area of the switch or with more switchable areas of neighboured switches, so that the light can pass through the cut-out and the front panel out of the control device.

The main idea of the present invention is at least one cut-out in the button panel, wherein the cut-out is arranged behind a switchable area. The light through the button panel can pass through the cut-out and the front panel. It is not necessary that the button panel is made of a transparent material. The material of the button panel has no influence to the illumination of the switches and the control device. The material for the button panel may be selected independently of its optical properties. This allows a reduction of the costs. In particular, the button panel may be also used as a printed circuit board carrying electric and/or electronic elements of the control device.

According to a first preferred embodiment of the control device of the present invention, the reflector element is formed as a half-shell and includes a first reflecting zone and a second reflecting zone, wherein the first reflecting zone is flat and arranged behind the at least one light source element and the second reflecting zone is concave shaped and arranged behind the cut-out.

Still preferably, the at least one light source element is arranged beside, below and/or above the cut-out. The indications "beside, below and/or above the cut-out" as used herein refer to an essentially vertical arrangement of the control device on a frontal face of the domestic appliance.

The flat first reflecting zone that is arranged behind the light source element and the concave shaped second reflecting zone that is arranged behind the cut-out allow a homogeneous illumination of the switch and/or the switchable area and prevent hot spots thereon.

Preferably, the button panel is made of a non-transparent material. The cut-out or cut-outs allow the use of the non-transparent material for the button panel. The material of the button panel has no influence to the illumination of the switch or switchable area. The material for the button panel may be selected independently of its optical properties. This contributes to a reduction of the costs.

In a similar way, at least that portion or those portions of the front panel arranged in front of the switch or switches are made of a transparent or semi-transparent material. For example, the whole front panel is made of a transparent or semi-transparent material, and an opaque lacquer is applied onto these portions, which are not in front of the switches. Additionally, a clear lacquer may be applied onto those portions in front of the switches. The opaque and clear lacquer may be applied onto the front side and/or the rear side of the front panel.

A printed icon can be provided inside a clear area of the front panel that is not covered by an opaque lacquer and that corresponds at least in its location and preferably also in its shape to a cut-out of the underlying button panel that comprises a switch. The clear area of the front panel that comprises the printed icon can be surrounded by at least one opaque printed non-switchable area so that the light that is emitted from a light source element can only shine through the front panel in the clear area thereof. In that way, the printed icon inside the clear area of the front panel is illuminated and provides a visible indication on the front side of the front panel of a touch-sensitive switch which is provided below the front panel at the corresponding position of the cut-out in the button panel. The printed icon preferably has in addition a suitably chosen design that is indicative of the functionality of the corresponding switch.

According to the present invention, said visible indication of a switch can be provided on the front panel without any physical change of the front surface of the front panel in its area that corresponds to said switch. In that way, the present invention provides a considerable advantage by the uniform aesthetical appearance of the front panel and in an increased lifetime endurance of the areas of the front surface of the front panel which correspond to switches.

The front panel is preferably formed essentially of a transparent or semi-transparent material that can be covered, preferably on most of its area, by an opaque lacquer that corresponds to one or more printed non-switchable areas of the front panel. The switchable areas of the front panel are essentially left free of the opaque lacquer but may be covered by a transparent lacquer. A switchable area can typically have a rectangular shape that corresponds in its location, its shape and its size to a rectangular cut-out of the underlying button panel which comprises a touch-sensitive switch. But a variety of suitable other shapes of cut-outs in the button panel and of the corresponding switchable areas of the front panel, such as for example a circular shape, are also possible. The switchable areas should essentially match in the relative location the corresponding cut-outs of the underlying button panel in order to allow a secure actuation of the switches by the user on the front panel. However, the shape and the size of a switchable area can but need not closely match the shape and size of the corresponding cut-out. Essentially, the shape of a switchable area that is illuminated via the corresponding cut-out should allow a user to identify safely the position on the front panel that corresponds to the switch. However, the choice of the relative shapes and sizes of the cut-outs and the switchable areas and can be influenced by aesthetical considerations. For example a close match in shape and size of both a cut-out in the button panel and a corresponding switchable area of the front panel will lead to a rather sharply delimited and essentially uniformly illuminated switchable area on the front panel. A switchable area that is bigger than the underlying cut-out of the button panel may have a fainter illumination in its border region, etc.

A switchable area of the front panel that is essentially left free of the opaque lacquer can preferably comprise a suitably chosen printed icon that can be indicative of the functionality of the corresponding switch. The printed icons can be chosen for example from suitable icons that are per se known in the prior art. According to the invention, a printed icon can be formed in a variety of ways inside a switchable area of the front panel. For example, a printed icon can be printed with an opaque lacquer inside a switchable area that is otherwise left free of the opaque lacquer of the surrounding printed non-switchable area of the front panel. In alternative, a switchable area can also be covered by the opaque lacquer of the surrounding non-switchable area for almost all of its own area with the exception of the printed icon itself which is left transparent in that it either is not covered by any lacquer or in that it is covered by a transparent lacquer. Such an embodiment of a transparent printed icon is actually one example of the above-disclosed situation wherein a switchable area does not match precisely in its size and its shape to the underlying cut-out of the button panel. However, also in that case the relative positions of the transparent printed icon and the underlying cut-out in the button panel match suitably to safely identify the position on the front panel of corresponding switch.

Further, the button panel and/or the front panel may be or include a printed circuit board. This reduces the number of components of the control device.

Moreover, the button panel may include at least one conductor track. The conductor track may be connected to the switch and/or to other components of the control device. Also a plug may be provided for an electrical connection to other parts of the appliance.

At least one conductor track may enclose the cut-out on a front side or rear side of the button panel, wherein at least one conductor track is responsive to touching the switchable area in front of the cut-out. For example, this conductor track may be used a sensor for detecting a human finger touch the front panel.

In particular, the button panel may be provided for carrying electric and/or electronic elements. Thus, the button panel may be the carrier of the circuit of the control device. The front panel covers the front side of the control device. The front panel may be made of transparent glass or plastics, wherein printed icons may be applied on the switchable areas. In a similar way, non-switchable areas may be printed by opaque ink. Each of the printed icons and/or the printed non-switchable areas may be printed to the front side and/or to the rear side of the front panel.

According to a second preferred embodiment of the control device of the present invention at least part of and preferably all of the printed icons are printed on the rear side of the front panel and/or at least one, preferably all printed non-switchable areas are printed on the rear side of the front panel. At the rear side of the front panel, the printed icons and the printed non-switchable areas are protected by the front panel against any abrasion by the user who touches the front side of the front panel for actuating a switch or for cleaning the front panel. In addition, the aesthetic appearance of the front panel is better if the printed icons and/or the printed non-switchable areas are applied on the rear side of the front panel.

Furthermore, at least a part of the electric and/or electronic elements may be arranged around the at least one cut-out. This allows a compact structure of the control device.

The switchable area of the front panel may be bigger or smaller than the cut-out. If the cut-out is completely enclosed by the conductor track, then the switchable area is bigger than the corresponding cut-out. If the cut-out is only partially enclosed by the conductor track, then the switchable area may be smaller than the corresponding cut-out.

Further, the switch may include a number of light source elements with different colours. The switch and/or switchable area can be illuminated by different colours.

Moreover, the switch may include a number of light source elements with the same colour. The switch and/or switchable area can be illuminated by a different brightness.

For example, the light source element may be a bulb or light emitting diode (LED).

The present invention relates also to a button panel for the control device mentioned above, wherein the button panel includes at least one cut-out, wherein the cut-out corresponds with one switch or more neighboured switches of the control device, so that the light through the button panel can pass through the cut-out out of the control device.

The object of the present invention is also achieved by a method for assembling a control device according to claim 11.

The present invention relates to the method for assembling the control device, in particular for a domestic appliance, comprising at least one switch being responsive to touching a switchable area on a front side of a front panel in front of said switch by a user, said method comprises the steps of:
providing at least one button panel,
preparing the button panel with at least one cut-out, wherein the cut-out corresponds with one switchable area of the switch or more switchable areas of neighboured switches,
applying at least one conductor track onto the button panel,
providing the at least one front panel,
connecting the button panel to the front panel,
attaching at least one light source element at a rear side of the button panel, and
attaching at least one reflector element at the rear side of the button panel and behind the light source element, so that the light can pass through the cut-out and the front panel out of the control device.

According to a first preferred embodiment of the method of the present invention for assembling a control device, the reflector element is formed as a half-shell and includes a first reflecting zone and a second reflecting zone, wherein the first reflecting zone is flat and arranged behind the at least one light source element and the second reflecting zone is concave shaped and arranged behind the cut-out. Preferably, the at least one light source element is arranged beside, below and/or above the cut-out.

According to a second preferred embodiment of the method of the present invention for assembling a control device, at least part of and preferably all of the printed icons are printed on the rear side of the front panel and/or at least one, preferably all printed non-switchable areas are printed on the rear side of the front panel. At the rear side of the front panel, the printed icons and the printed non-switchable areas are protected by the front panel against any abrasion by the user who touches the front side of the front panel for actuating a switch or for cleaning the front panel. In addition, the aesthetic appearance of the front panel is better if the printed icons and/or the printed non-switchable areas are applied on the rear side of the front panel.

In particular, the provided front panel is made of a transparent or semi-transparent material or at least that portion or those portions of the front panel arranged in front of the switch or switches, respectively, are made of a transparent or semi-transparent material.

Further, at least one of the applied conductor tracks encloses at least partially the cut-out on a front or rear side of the button panel, wherein at least one conductor track is responsive to touching the switchable area in front of the cut-out by the user.

Preferably, electric and/or electronic elements are attached on the button panel, after the at least one conductor track has been applied on the button panel.

The method is provided for assembling the control device mentioned above.

Novel and inventive features of the present invention are set forth in the appended claims.

BRIEF DESCRIPTION OF DRAWINGS

The present invention will be described in further detail with reference to the drawings, in which FIG. 6a illustrates a schematic cross sectional side view of the button panel according to the variant of FIG. 5, FIG. 6b illustrates the front panel of the button panel of FIG. 6a.

DETAILED DESCRIPTION OF THE PREFERRED EMBODIMENT

Figure 1:
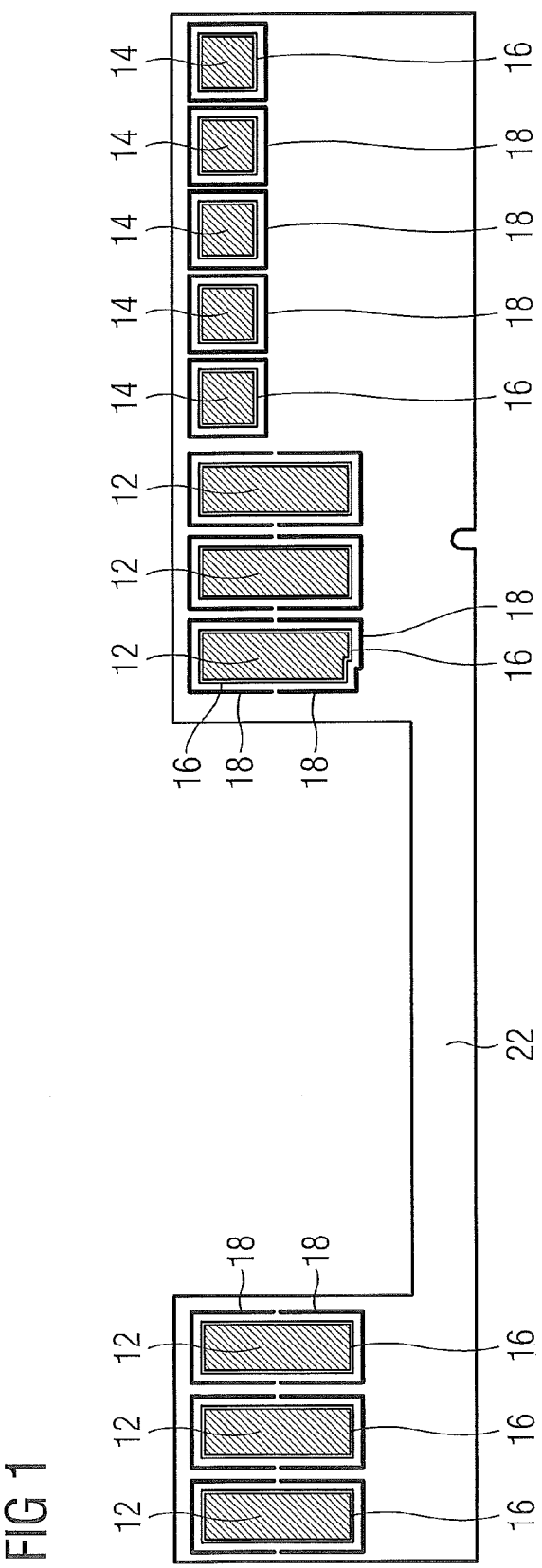
FIG. 1 illustrates a schematic front view of a button panel for a control device according to the present invention.

FIG. 1 illustrates a schematic front view of a button panel 22 for a control device according to the present invention. The control device is a part of a domestic appliance, for example a domestic oven. The control device is provided for adjusting relevant parameters of the appliance.

The button panel 22 is formed as a sheet element. In this example, the button panel 22 is formed as a rectangular sheet element with a rectangular recess. The button panel 22 includes a plurality of cut-outs 12 and 14. Each cut-out 12 and 14 corresponds with at least one switch 20.

In this example, the cut-outs 12 and 14 are arranged in series. The button panel 22 according to this embodiment includes six rectangular cut-outs 12 and five substantially square cut-outs 14. The rectangular cut-out 12 may be provided for two corresponding switches or one tiltable switch.

The cut-outs 12 and 14 are enclosed by an inner conductor track 16 in each case. The inner conductor tracks 16 are enclosed again by a corresponding outer conductor track 18 in each case. Alternatively, the cut-outs 12 and 14 may be enclosed by only one conductor track. If one conductor track is provided, then the conductor track acts as transmitting and receiving antenna of the switch 20. If two conductor tracks 16 and 18 are provided, then one of the conductor tracks 16 and 18 acts as transmitting antenna and the other one of the conductor tracks 16 and 18 acts as receiving antenna. In this example, the rectangular cut-outs 12 are enclosed by two inner conductor tracks 16 in each case, which are enclosed again by two corresponding outer conductor tracks 18. Alternatively, the rectangular cut-outs 12 may be enclosed by one inner conductor track 16 in each case, which are enclosed again by one corresponding outer conductor track 18. The square cut-outs 14 are enclosed by one inner conductor track 16 and one outer conductor track 18. In each case, the conductor tracks 16 and 18 are used as sensor for detecting a human finger.

The button panel 22 is made of a material, which allows an arrangement of electric and/or electronic components on said front panel 10. Thus, the button panel 22 may be also provided as a printed circuit board. Preferably, the button panel 22 is made of a non-transparent material.

Figure 2:
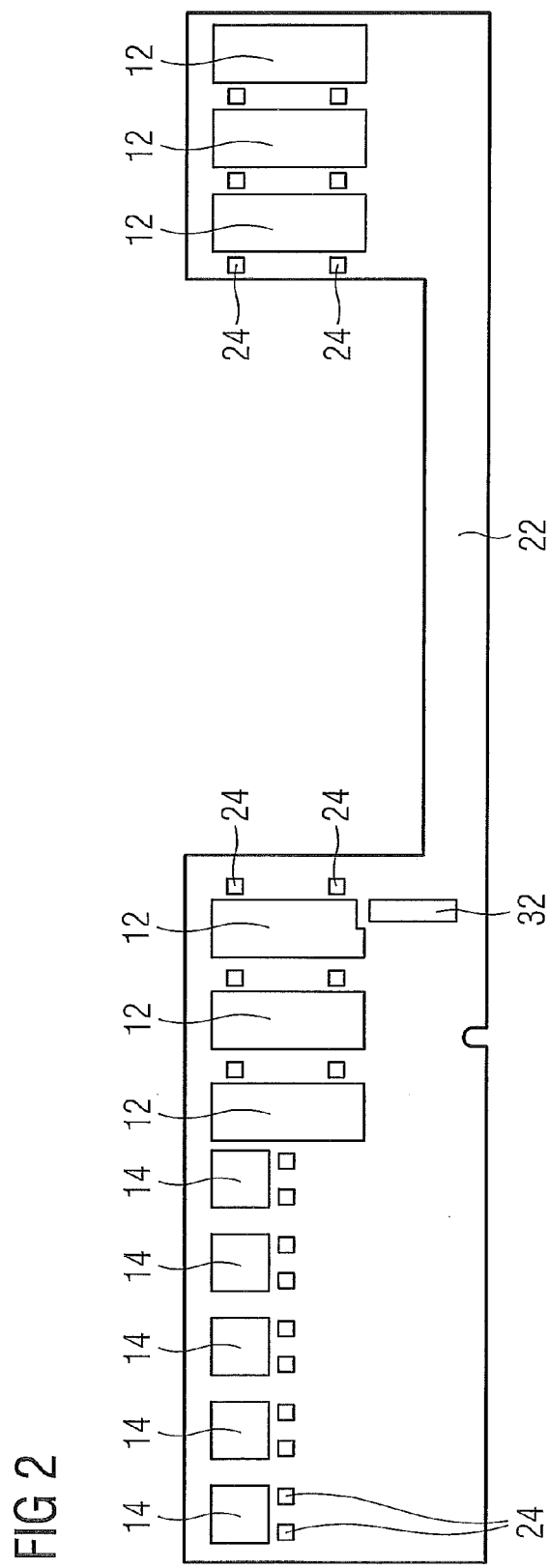
FIG. 2 illustrates a schematic rear view of the button panel for the control device of FIG. 1.

FIG. 2 illustrates a schematic rear view of the button panel 22 for the control device according to the present invention.

The button panel 22 includes the six rectangular cut-outs 12 and the five substantially square cut-outs 14. A number of light source elements 24 is arranged at the rear side of the button panel 22. In this example, each cut-out 12 and 14 corresponds with two light source elements 24. The light source elements 24 for the rectangular cut-outs 12 are arranged beside the corresponding cut-out 12 in each case. The two light source elements 24 for one rectangular cut-out 12 are arranged one upon the other. The light source elements 24 for the substantially square cut-outs 14 are arranged below the corresponding cut-out 14 in each case. The two light source elements 24 for one substantially square cut-out 14 are arranged side-by-side. Further, a plug 32 is arranged at the rear side of the button panel 22. The plug 32 is provided for connections to other parts of the appliance.

Figure 3:
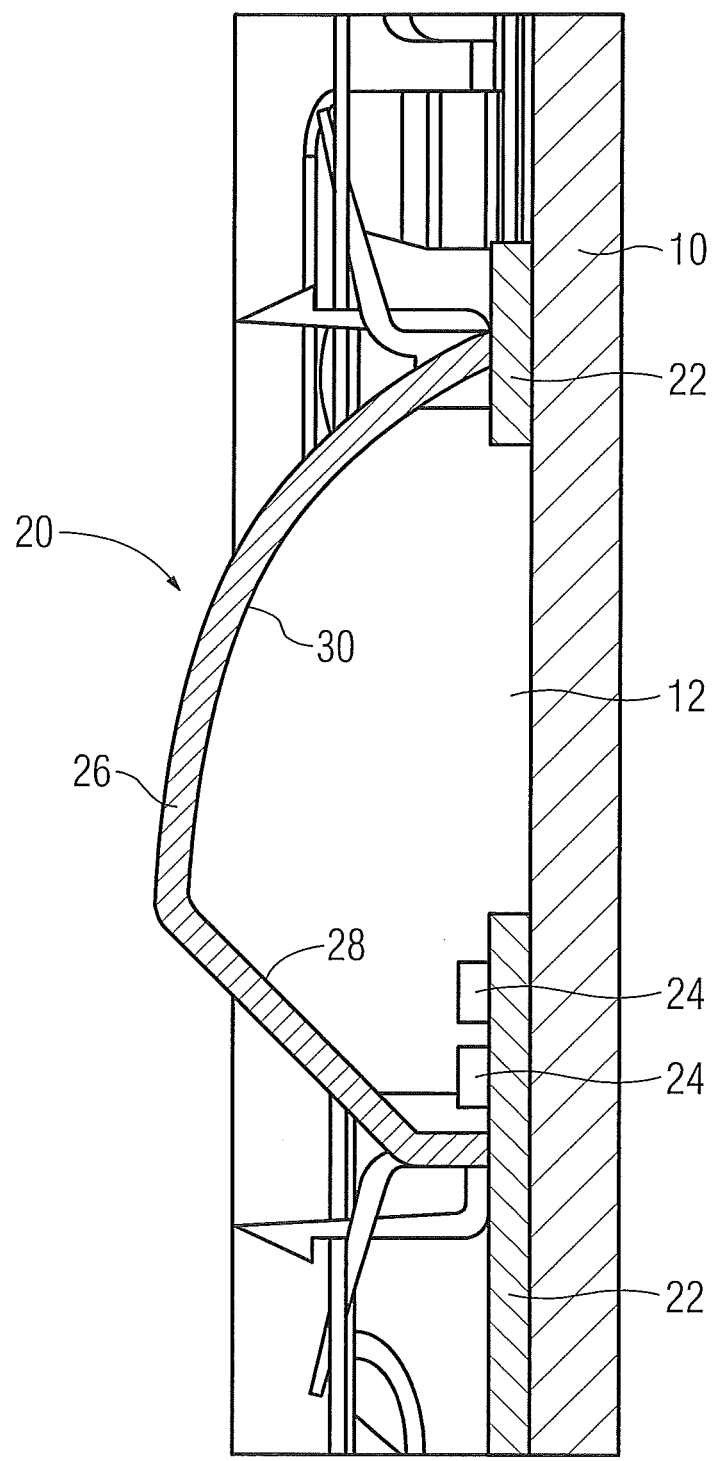
FIG. 3 illustrates a schematic cross sectional side view of the control device according to a first preferred embodiment of the present invention.

FIG. 3 illustrates a schematic cross sectional side view of the control device according to a first preferred embodiment of the present invention. The cross sectional side view relates to a position, in which a switch 20 is arranged on the front panel 10. The front panel 10 is arranged vertically. The switch 20 is arranged at the rear side of said front panel 10.

For example, the switch 20 may be of a capacitive type, an inductive type, an optical type, an infrared type or a funk type. The switch 20 comprises a portion of the button panel 22, the number of light source elements 24 and a reflector element 26. The switch 20 comprises the corresponding cut-out 12 of the button panel 22 and that part of the button panel 22, which encloses said cut-out 12.

The button panel 22 is formed as a sheet element. The button panel 22 is directly arranged at the rear side of the front panel 10. The button panel 22 may be pressed by a supporting device, e.g. by the reflector element 26, against the rear side of the front panel 10. Further, the button panel 22 may be glued by a transparent adhesive to the rear side of the front panel 10. The plane of the button panel 22 extends in parallel to the plane of the front panel 10. The button panel 22 is at least partially a printed circuit board. The button panel 22 includes one or more cut-outs 14. The area of the cut-out 14 is equal as or bigger than the front area of the switch 20. That area of the front side of the front panel 10 being responsive to touching by the user defines the switchable area of the switch 20.

The light source elements 24 are arranged at the rear side of the button panel 22 and beside, below and/or above the cut-out 14. FIG. 2 shows two light source elements 24. In general, one light source element 24 or an arbitrary number of light source elements 24 may be provided for each switch 20. Several light source elements 24 allow the generation of different colours, chromaticity and/or brightness. The colours, chromaticity and/or brightness may be changed, if the button panel 22 has been touched, and/or if a corresponding operation has been activated or deactivated, and/or if a parameter has been changed. For example, the light source elements 24 are bulbs and/or light emitting diodes. The light source elements 24 are located directly at the button panel 22, so that no further circuit boards are required as a carrier for said light source elements 24.

The reflector element 26 is arranged behind the button panel 22. The reflector element 26 is substantially formed as a half-shell. In this example, the reflector element 26 is connected to the switch 20 by a snap-in mechanism. In general, the reflector element 26 is connectable to the switch 20 by arbitrary means. Preferably, the reflector element 26 includes two different reflecting zones 28 and 30. A first reflecting zone 28 forms a lower portion of the reflector element 26. A second reflecting zone 28 forms an upper portion of the reflector element 26. The first reflecting zone 28 is substantially flat and arranged at the same level as the light source elements 24. The plane of the first reflecting zone 28 forms substantially an angle of about 45° in relation to the plane of the button panel 22 and front panel 10. The second reflecting zone 30 is concave shaped. The light emitted by the light source elements 24 is reflected by the first reflecting zone 28 and guided to the second reflecting zone 30. From the second reflecting zone 30 the light is reflected again to the rear side of the button panel 22. The inner side of the reflector element 26 may be covered by a reflecting layer in order to improve the reflecting ability.

The button panel 22 is indirectly illuminated by the light source elements 24 via the reflector element 26. The indirect illumination prevents "hot spots" and dark areas, and allows a homogeneous illumination of at least a part of the switchable areas.

Different switches 20 of the button panel 22 may be illuminated separately. Each switch 20 may either correspond with one reflector element 26 in each case or one reflector element 26 is provided for several neighboured switches 20. If one reflector element 26 extends behind several neighboured switches 20, then said reflector element 26 may be subdivided into separate sections by rib elements or the like. Thus, the light source elements 24 correspond with certain switches 20.

Figure 4A:
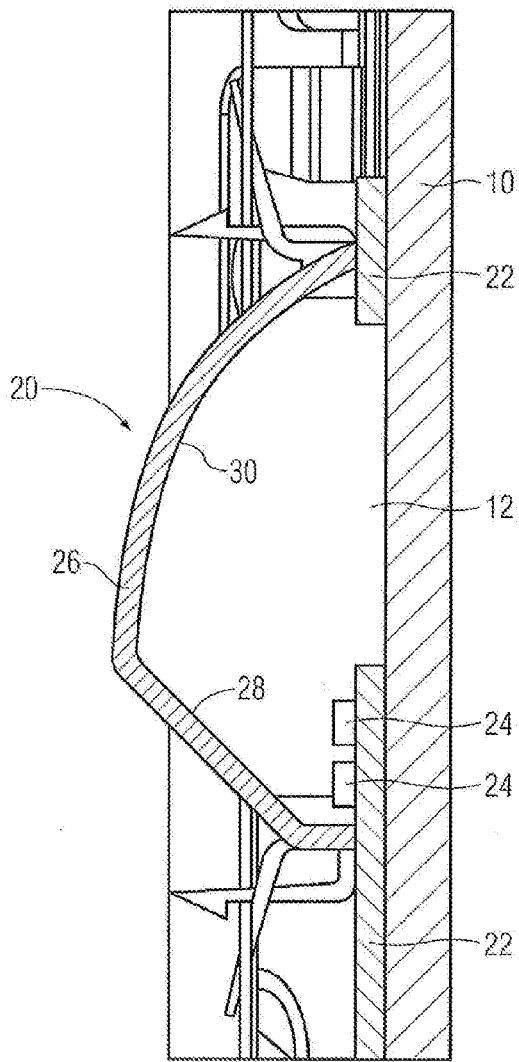
FIG. 4a illustrates a schematic cross sectional side view of the control device according to a second preferred embodiment of the present invention.
Figure 4B:
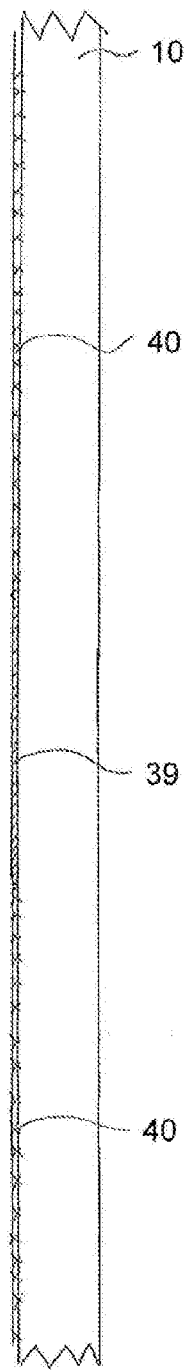
FIG. 4b illustrates in further detail only the front panel 10 that is shown in FIG. 4a, FIG. 5 illustrates a schematic cross sectional side view of a preferred variant of the button panel of the present invention.

FIG. 4a illustrates a schematic cross sectional side view of the control device according to a second preferred embodiment of the present invention. FIG. 4b illustrates schematically in further detail only the front panel 10 that is shown in FIG. 4a. The button panel 22 and its details are not shown in FIG. 4b. However, FIG. 4b shows in addition a printed icon 39 and two printed non-switchable areas 40 which are arranged on both sides next to the printed icon 39. The printed icon 39 and the two printed non-switchable areas 40 are formed on the rear side of the front panel 10 that faces towards the button panel 22. The printed icon 39 shown in FIG. 4b is provided essentially in correspondence with the rectangular cutout 12 in the button panel 22 that is shown in FIG. 4a and that corresponds to a switch 20. The printed icon 39 is suitably aligned with the rectangular cut-out 14 in order to be illuminated by the light source elements 24 to shine through the front panel 10 in order to be indicative of the corresponding switch 20 on the frontal side of the front panel 10. The front panel 10 consists of a material that has a suitably chosen transparency that is adapted to the strength of the light source elements 24 and the printed icon 39 in order to allow said visible indication of the switch. The printed icon can preferably in addition have a suitable design that is indicative of the functionality of the corresponding switch.

The two printed non-switchable areas 40 that are shown in FIG. 4b are provided on the rear side of the front panel 10 on either side next to the printed icon 39. Thus, the two printed non-switchable areas 40 are arranged on the rear side of the front panel 10 essentially in correspondence to regions of the button panel 22, that is shown in FIG. 4a, that lie outside of the cut-out 12. In that way the front panel 10 that consists of a transparent or semi-transparent material can be masked on its rear side in order to allow the light that is emitted from the light source elements 24 to shine through the front panel only in correspondence of the cut-outs 12 and hence of the corresponding switches.

The two printed non-switchable areas 40 that are shown in the right half of FIG. 4 are provided on the rear side of the front panel 10 on either side next to the printed icon 39. Thus, the two printed non-switchable areas 40 are arranged on the rear side of the front panel 10 essentially in correspondence to regions of the button panel 22, that is shown in the left half of FIG. 4, that lie outside of the cut-out 12.

In that way the front panel 10 that consists of a transparent or semi-transparent material can be masked on its rear side in order to allow the light that is emitted from the light source elements 24 to shine through the front panel only in correspondence of the cut-outs 12 and hence of the corresponding switches.

Figure 5:
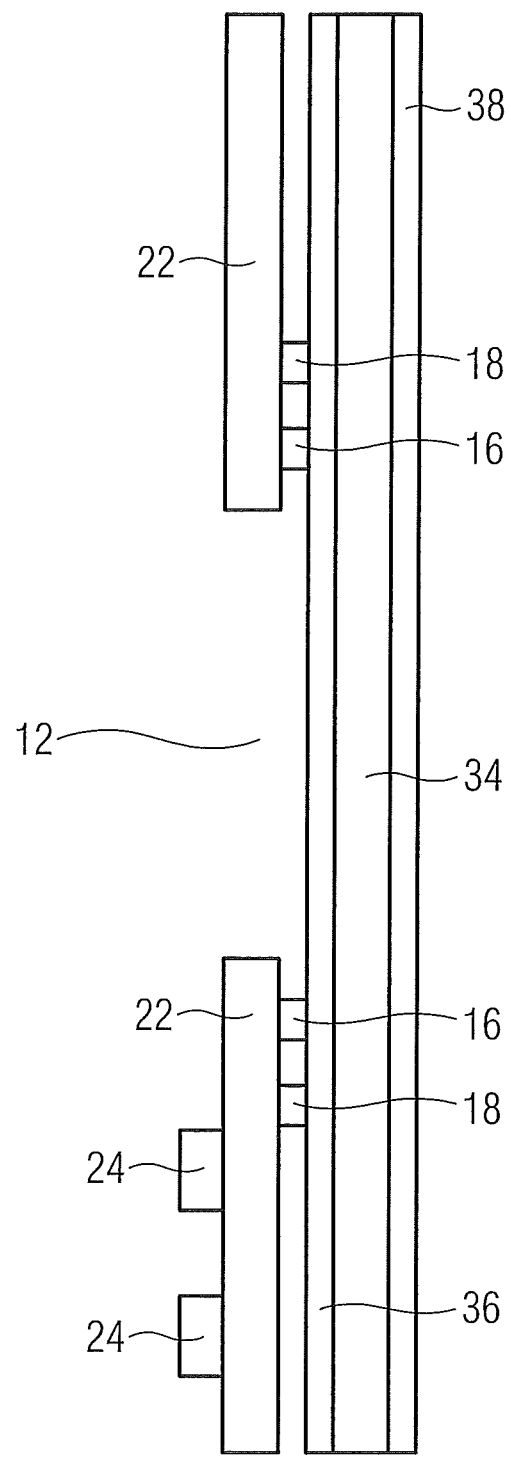

FIG. 5 illustrates a schematic cross sectional side view of a preferred variant of the button panel 22 of the present invention. The button panel 22 of the preferred variant is additionally provided with a rear gluing tape 36, a filter panel 34 and a front gluing tape 38.

The filter panel 34 is an optional component of the button panel 22. For example, the filter panel 34 is a colour filter or a light diffusing foil. The rear gluing tape 36 connects the filter panel 34 to the button panel 22. The front gluing tape 38 connects the filter panel 34 to the front panel 22. Instead of the filter panel 34, a translucent printing may be applied on the illuminated area of the front panel 10. The conductor tracks 16 and 18 are in the shown example arranged between the button panel 22 and the rear gluing tape 36.

The cut-outs 12 and 14 in the button panel 22 allow the use of a non-transparent material for said button panel 22. Thus, the material of the button panel 22 has no influence to the illumination of the switches 20. The material for the button panel 22 may be selected independently of its optical properties. This reduces the costs of the control device. In particular, the button panel 22 may be also used as a printed circuit board carrying electric and/or electronic elements of the control device.

The cut-outs 12 and 14 as well as the conductor tracks 16 and 18 are provided during the production of the button panel 22. For example, the cut-outs 12 and 14 and the proper button panel 22 are prepared by one step, wherein the conductor tracks 16 and 18 are applied afterwards. The button panel 22 is produced in the same way and similar as a printed circuit board. Further, the button panel 22 may be a double-sided printed circuit board. For example, the button panel 10 is made of FR4, CEM1, CEM3 or the like material. Then, electric and/or electronic elements are fixed on the button panel 10. Next, the light source elements 24 and the reflector elements 26 are applied to the button panel 22. At last, the button panel 10 is glued or pressed onto the front panel 10.

The conductor tracks 16 and 18 are the sensitive elements of the touch switch. The conductor tracks 16 and 18 may act a transmitting and/or receiving antenna of the touch switch 20. In the latter case only one conductor track 16 or 18 may be necessary. If both conductor tracks 16 and 18 are provided, then one conductor tracks 16 or 18 acts as transmitting antenna and the other conductor track 18 or 16 acts as receiving antenna. The conductor tracks 16 and 18 form the sensitive part of the capacitive or inductive switch. Two conductor tracks 16 and 18 form the touch sensor or proximity sensor. An electric or electromagnetic field is sent and received by the conductor tracks 16 and 18. The physical properties of said electric or electromagnetic field are changed by touching the switchable area by the human finger. A circuit for evaluating the signals on the conductor tracks 16 and 18 may be arranged on the button panel 22 or on another circuit board connected to said button panel 22 via the plug 32.

FIG. 6a illustrates a schematic cross sectional side view of the button panel according to the variant shown in FIG. 5. FIG. 6b illustrates schematically the front panel 10 according to the second embodiment of the control device of the invention that is not shown in FIG. 4. The front panel 10 can be fixed to the shown variant of the button panel 22 via the front gluing tape 38 on the external face of filter panel 34 that carries the rear gluing tape 36 that connects the filter panel 34 to the button panel 22. FIG. 6b shows a printed icon 39 and two printed non-switchable areas 40 which are arranged on both sides next to the printed icon 39. The printed icon 39 and the two printed non-switchable areas 40 are formed on the rear side of the front panel 10 that faces towards the filter panel and the button panel 22. The printed icon 39 shown in FIG. 6b is provided essentially in correspondence with the rectangular cut-out 12 in the button panel 22 that is shown in FIG. 6a and that corresponds to a switch 20. The printed icon 39 is suitably aligned with the rectangular cut-out 14 in order to be illuminated by the light source elements 24 to shine through the front panel 10 in order to be indicative of the corresponding switch 20 on the frontal side of the front panel 10. The front panel 10 consists of a material that has a suitably chosen transparency that is adapted to the strength of the light source elements 24 and the printed icon 39 in order to allow said visible indication of the switch. The printed icon can preferably in addition have a suitable design that is indicative of the functionality of the corresponding switch.

The two printed non-switchable areas 40 that are shown in FIG. 6b are provided on the rear side of the front panel 10 on either side next to the printed icon 39. Thus, the two printed non-switchable areas 40 are arranged on the rear side of the front panel 10 essentially in correspondence to regions of the button panel 22, that is shown in FIG. 6a, that lie outside of the cut-out 12. In that way the front panel 10 that consists of a transparent or semi-transparent material can be masked on its rear side in order to allow the light that is emitted from the light source elements 24 to shine through the front panel only in correspondence of the cut-outs 12 and hence of the corresponding switches.

Although an illustrative embodiment of the present invention has been described herein with reference to the accompanying drawings, it is to be understood that the present invention is not limited to that precise embodiment, and that various other changes and modifications may be affected therein by one skilled in the art without departing from the scope or spirit of the invention. All such changes and modifications are intended to be included within the scope of the invention as defined by the appended claims.

LIST OF REFERENCE NUMERALS 10 front panel
12 cut-out
14 square cut-out
16 inner conductor track
18 outer conductor track
20 switch
22 button panel
24 light source element
26 reflector element
28 first reflecting zone
30 second first reflecting zone
32 plug
34 filter panel
36 rear gluing tape
38 front gluing tape
39 printed icon
40 printed non-switchable area

The invention claimed is:

1. A control device for a domestic appliance, said control device comprising:
   at least one front panel, at least one button panel arranged behind the front panel,
at least one switch being responsive to a user's touch of touching a switchable area on a front side of the front panel, wherein:
the switch includes at least one light source element arranged at a rear side of the button panel and provided for illuminating the rear side of the front panel,
the switch includes at least one reflector element arranged behind the button panel and the light source element and provided for reflecting the light from the light source element to the rear side of the button panel,
the button panel includes at least one cut-out, wherein the cut-out corresponds with one switchable area of the switch or with more switchable areas of neighboured switches, so that the light can pass through the cut-out and the front panel out of the control device,
the reflector element is formed as a half-shell and there is unobstructed air gap between the reflector and the at least one light source element.

2. The control device according to claim 1, wherein the reflector element includes a first reflecting zone and a second reflecting zone, wherein the first reflecting zone is flat and arranged behind the at least one light source element and the second reflecting zone is concave shaped and arranged behind the cut-out wherein the at least one light source element is arranged beside, below and/or above the cut-out.

3. The control device according to claim 1, characterized in that it comprises at least one printed icon that is formed on the rear side of the front panel and/or at least one non-switchable area that is formed on the rear side of the front panel.

4. The control device to claim 1, wherein the button panel is made of a non-transparent material.

5. The control device according to claim 1, characterized in that at least that portion or those portions of the front panel arranged in front of the switch or switches, respectively, are made of a transparent or semi-transparent material.

6. The control device according to claim 1, wherein the button panel is or includes a printed circuit board wherein the button panel includes at least one conductor track, wherein at least one conductor track encloses at least partially the cut-out on a front side of the button panel and/or on a rear side of the button panel, and wherein at least one conductor track is responsive to touching the switchable area in front of the cut-out.

7. The control device according to claim 1,
characterized in that the button panel is provided for carrying electric and/or electronic elements, wherein at least a part of the electric and/or electronic elements is arranged around the at least one cut-out.

8. The control device according to claim 1, characterized in that the switch includes a number of light source elements with the same colour and/or with different colours wherein the light source element is a bulb or a light emitting diode.

9. A button panel for a control device according to claim 1,
characterized in that
the button panel includes at least one cut-out, wherein the cut-out corresponds with one switch or more neighboured switches of the control device, so that the light can pass through the cut-out and the front panel out of the control device.

10. A method for assembling a control device for a domestic appliance, comprising at least one switch being responsive to a user's touch of a switchable area on a front side of a front panel in front of said switch, said method comprises the steps of:
providing at least one button panel,
preparing the button panel with at least one cut-out, wherein the cut-out corresponds with one switchable area of the switch or more switchable areas of neighboured switches,
applying at least one conductor track onto the button panel,
providing the at least one front panel,
connecting the button panel to the front panel, attaching at least one light source element at a rear side of the button panel, and
attaching at least one reflector element at the rear side of the button panel and behind the light source element, so that the light can pass through the cutout and the front panel out of the control device,
wherein the at least one reflector element is formed as a half-shell and there is unobstructed air gap between the reflector element and the at least one light source element.

11. The method according to claim 10, wherein the provided front panel is made of a transparent or semi-transparent material or at least that portion or those portions of the front panel arranged in front of the switch or switches, respectively, are made of a transparent or semi-transparent material.

12. The method according to claim 10, wherein at least one of the applied conductor tracks encloses at least partially the cut-out on a front side of the button panel and/or on a rear side of the button panel, wherein at least one conductor track is responsive to touching the switchable area in front of the cut-out by the user.

13. The method according to claim 10, wherein the reflector element includes a first reflecting zone and a second reflecting zone, wherein the first reflecting zone is flat and arranged behind the at least one light source element and the second reflecting zone is concave shaped and arranged behind the cut-out, wherein the at least one light source element is arranged beside, below and/or above the cut-out, wherein at least one printed icon is formed on the rear side of the front panel and/or at least one non-switchable area is formed on the rear side of the front panel.

14. The method according to claim 13, wherein electric and/or electronic elements are attached on the button panel, after the at least one conductor track has been applied on the button panel.

15. The method according to claim 13, wherein the method is provided for assembling a control device comprising:
at least one front panel,
at least one button panel arranged behind the front panel,
at least one switch being responsive to touching a switchable area on a front side of the front panel by a user,
the switch includes at least one light source element arranged at a rear side of the button panel and provided for illuminating the rear side of the front panel, and
the switch includes at least one reflector element arranged behind the button panel and the light source element and provided for reflecting the light from the light source element to the rear side of the button panel,
wherein the button panel includes at least one cut-out, wherein the cut-out corresponds with one switchable area of the switch or with more switchable areas of neighboured switches, so that the light can pass through the cut-out and the front panel out of the control device.

* * * * *